United States Patent
Kwak et al.

(10) Patent No.: US 9,921,708 B2
(45) Date of Patent: Mar. 20, 2018

(54) ORGANIC LIGHT-EMITTING DIODE (OLED) DISPLAY INCLUDING TOUCH SENSOR

(71) Applicant: Samsung Display Co., Ltd., Yongin, Gyeonggi-Do (KR)

(72) Inventors: Gyung-Kook Kwak, Seoul (KR); Jang-Youp Shim, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 343 days.

(21) Appl. No.: 14/449,720

(22) Filed: Aug. 1, 2014

(65) Prior Publication Data
US 2015/0170575 A1 Jun. 18, 2015

(30) Foreign Application Priority Data
Dec. 18, 2013 (KR) .......................... 10-2013-0158710

(51) Int. Cl.
| | |
|---|---|
| *G09G 1/00* | (2006.01) |
| *G06F 3/047* | (2006.01) |
| *G06F 3/041* | (2006.01) |
| *G06F 3/044* | (2006.01) |
| *H01L 27/32* | (2006.01) |

(52) U.S. Cl.
CPC .............. *G06F 3/047* (2013.01); *G06F 3/044* (2013.01); *G06F 3/0412* (2013.01); *H01L 27/323* (2013.01)

(58) Field of Classification Search
CPC ............................ G06F 1/1626; G06F 3/0412
See application file for complete search history.

(56) References Cited

U.S. PATENT DOCUMENTS

| | | | | |
|---|---|---|---|---|
| 2012/0062485 | A1* | 3/2012 | Kim ....................... | G06F 3/0412 345/173 |
| 2012/0212445 | A1* | 8/2012 | Heikkinen ............ | G06F 1/1626 345/174 |
| 2013/0176253 | A1* | 7/2013 | Baek ..................... | G06F 1/1626 345/173 |

FOREIGN PATENT DOCUMENTS

| | | |
|---|---|---|
| KR | 10-1080152 B1 | 10/2011 |
| KR | 10-1160797 B1 | 6/2012 |
| KR | 10-2012-0095818 A | 8/2012 |
| KR | 10-2013-0065075 A | 6/2013 |
| KR | 10-2013-0080647 A | 7/2013 |

* cited by examiner

*Primary Examiner* — Michael Faragalla
(74) *Attorney, Agent, or Firm* — Knobbe Martens Olson & Bear LLP

(57) ABSTRACT

An organic light-emitting diode (OLED) display is disclosed. In one aspect, the OLED display includes a display substrate, an encapsulation substrate formed over the display substrate, and a window formed over the encapsulation substrate, wherein the window includes a surface facing the display substrate. The OLED display further includes a contact sensing layer formed on the surface of the window and a touch driver formed on the surface of the window and electrically connected to the contact sensing layer, wherein the touch driver is configured to drive the touch sensing layer.

13 Claims, 8 Drawing Sheets

ORGANIC LIGHT-EMITTING DIODE (OLED) DISPLAY INCLUDING TOUCH SENSOR

CROSS-REFERENCE TO RELATED APPLICATIONS

This application claims priority to and the benefit of Korean Patent Application No. 10-2013-0158710 filed in the Korean Intellectual Property Office on Dec. 18, 2013 the entire contents of which are incorporated herein by reference.

BACKGROUND

Field

The described technology generally relates to an organic light-emitting diode (OLED) display, and more particularly, to an OLED display including a contact sensing layer.

Description of the Related Technology

Display devices such as liquid crystal displays (LCDs), organic light-emitting diode (OLED) displays, and electrophoretic displays (EPDs) include a field generating electrode and an electro-optical active layer. For example, LCDs include a liquid crystal layer as the electro-optical active layer and electrophoretic displays include charged particles. OLED displays include an organic emitting layer as the electro-optical active layer.

The field generating electrode is connected to a switching element such as a thin film transistor (TFT) to receive a data signal and the electro-optical active layer converts the data signal into an optical signal to display an image.

Recently, display devices have further included a touch sensor enabling touch interactions with a user in addition to displaying images. The touch sensor determines whether an object approaches or contacts the screen and generates contact information about the contact position, etc., by detecting a change in pressure, charge, or light which are applied to the screen. The display device receives an image signal to display an image based on the contact information.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is an OLED display including a contact sensing layer and having a reduction in the thickness of the OLED display.

Another aspect is an OLED display including a display substrate, an encapsulation substrate formed on the display substrate, a window formed on the encapsulation substrate, a contact sensing layer formed on the surface of the window, and a touch driver formed on the surface of the window and electrically connected to the contact sensing layer. The touch driver is configured to drive the touch sensing layer.

The contact sensing layer may be comprise a plurality of first touch electrodes and a plurality of second touch electrodes formed on the same layer as the first touch electrodes.

The first and second touch electrodes may be alternately arranged so as to not overlap each other, the first touch electrodes may be electrically connected to each other in a first direction via a plurality of first connection portions, and the second touch electrodes are electrically connected to each other in a second direction crossing the first direction via a plurality of second connection portions.

The first connection portions may be formed on the same layer as the first touch electrodes and the second connection portions may be formed on a different layer from the second touch electrodes.

The OLED display may further comprise a plurality of first touch wires respectively electrically connected to the first touch electrodes and a plurality of second touch wires respectively electrically connected to the second touch electrodes, end portions of the first and second touch wires may form a first pad portion, and the first touch wires, the second touch wires, and the first pad portion may be formed on the same layer as the first and second touch electrodes.

The touch driver may be electrically connected to the first pad portion via a touch driver connection pattern.

The touch driver connection pattern may be electrically connected to the first pad portion, at least a portion of the touch driver connection pattern may overlap the first pad portion and the portion of the touch driver connection pattern may be formed on a different layer from the first pad portion.

The portion of the touch driver connection pattern may be formed on the same layer as the second connection portions.

The touch driver connection pattern and the second connection portions may be formed of the same material.

The OLED display may further comprise a touch flexible printed circuit board attached to the surface of the window.

The touch flexible printed circuit board may be electrically connected to the touch driver.

The OLED display may further include a display flexible printed circuit board attached to the display substrate.

The touch flexible printed circuit board may be electrically connected to the display flexible printed circuit board via a connector.

The display substrate may include an insulation substrate and a thin film display layer formed on the insulation substrate.

The thin film display layer may include a plurality of pixels, and each pixel includes an OLED.

Another aspect is an OLED display including a display substrate, an encapsulation substrate formed over the display substrate, a window formed over the encapsulation substrate, wherein the window includes a surface facing the display substrate, a contact sensing layer formed on the surface of the window, and a touch driver formed on the surface of the window and electrically connected to the contact sensing layer, wherein the touch driver is configured to drive the touch sensing layer.

The contact sensing layer includes a plurality of first touch electrodes and a plurality of second touch electrodes formed on the same layer as the first touch electrodes. The first and second touch electrodes are alternately arranged so as to not overlap each other, wherein the first touch electrodes are electrically connected to each other in a first direction via a plurality of first connection portions and wherein the second touch electrodes are electrically connected to each other in a second direction crossing the first direction via a plurality of second connection portions. The first connection portions are formed on the same layer as the first touch electrodes and the second connection portions are formed on a different layer from the second touch electrodes. The OLED display further includes a plurality of first touch wires respectively electrically connected to the first touch electrodes and a plurality of second touch wires respectively electrically connected to the second touch electrodes, wherein end portions of the first and second touch wires form a first pad portion and wherein the first touch wires, the second touch wires, and the first pad portion are formed on the same layer as the first and second touch electrodes.

The touch driver is electrically connected to the first pad portion via a touch driver connection pattern. The touch driver connection pattern are electrically connected to the first pad portion, wherein at least a portion of the touch driver connection pattern overlaps the first pad portion and wherein the portion of the touch driver connection pattern is formed on a different layer from the first pad portion. The portion of the touch driver connection pattern is formed on the same layer as the second connection portions. The touch driver connection pattern and the second connection portions are formed of the same material. The OLED display further includes a touch flexible printed circuit board attached to the surface of the window. The touch flexible printed circuit board is electrically connected to the touch driver. The OLED display further includes a display flexible printed circuit board attached to the display substrate. The touch flexible printed circuit board is electrically connected to the display flexible printed circuit board via a connector. The display substrate includes an insulation substrate and a thin film display layer formed over the insulation substrate. The thin film display layer includes a plurality of pixels and each of the pixels includes an OLED. The display substrate includes a display area and a peripheral area, wherein the touch driver is formed in the peripheral area, and wherein the touch driver does not overlap the encapsulation substrate.

Another aspect is an OLED display including a substrate, a plurality of pixels formed over the substrate, a transparent layer formed over the pixels and including a surface facing the substrate, a touch sensing layer formed on the surface of the transparent layer, and a touch driver formed on the surface of the transparent layer and configured to drive the touch sensing layer.

The OLED display further includes a first pad portion electrically connected to the touch sensing layer and interposed between the touch sensing layer and the touch driver and a second pad portion electrically connected to the touch driver and the touch flexible printed circuit board, wherein the touch flexible printed circuit board is attached to the second pad portion. The OLED display further includes a plurality of touch wires electrically connected the touch sensing layer and the first pad portion, wherein the first pad portion comprises a plurality of pads respectively corresponding to the touch wires, a touch driver connection pattern electrically connected to the pads of the first pad portion, and a touch driver connection portion electrically connected to the touch driver connection pattern and electrically connected to the touch driver. The OLED display further includes a display driver formed over the substrate and configured to drive the pixels and a display flexible printed circuit board attached to the substrate and electrically connected to the display driver, wherein the touch flexible printed circuit board is electrically connected to the display flexible printed circuit board via a connector. The contact sensing layer includes a plurality of first touch electrodes and a plurality of second touch electrodes formed on the same layer as the first touch electrodes, wherein the first touch electrodes are electrically connected to each other in a first direction via a plurality of first connection portions and wherein the second touch electrodes are electrically connected to each other in a second direction crossing the first direction via a plurality of second connection portions. The OLED display further includes an encapsulation substrate encapsulating the pixels on substrate, wherein the touch sensing layer is formed directly above the encapsulating substrate, wherein the substrate includes a display area and a peripheral area, and wherein the touch driver is formed in the peripheral area.

According to at least one embodiment, the touch driver is formed on the inner side of the window instead of on a flexible printed circuit board such that the thickness and width of the flexible printed circuit touch board can be decreased, thereby reducing the overall thickness of the OLED display.

In addition, the flexible printed circuit touch board may be easily bent.

DETAILED DESCRIPTION OF CERTAIN INVENTIVE EMBODIMENTS

Figure 1:
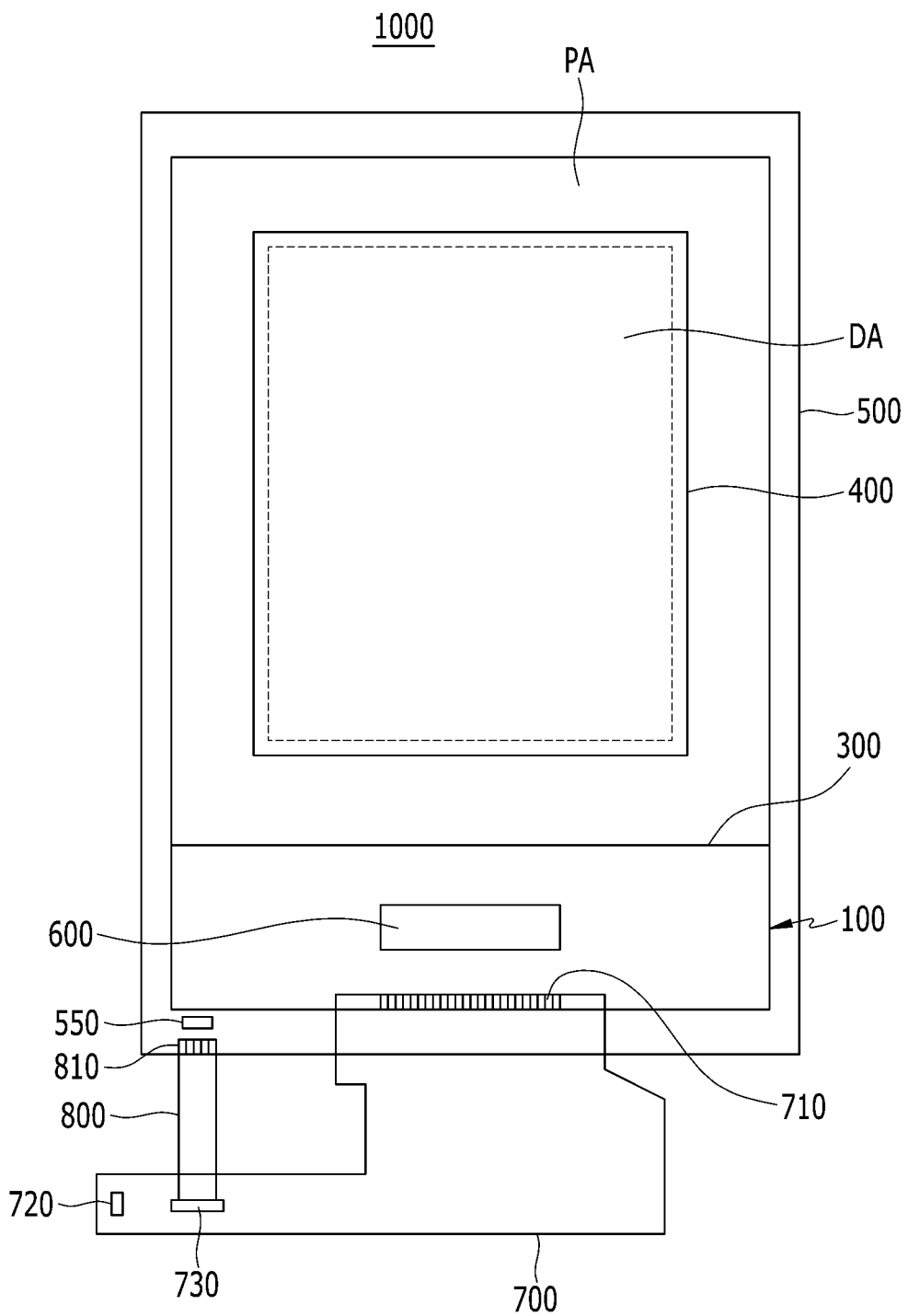
FIG. 1 is a schematic top plan view of an OLED display according to an exemplary embodiment.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology.

On the contrary, exemplary embodiments introduced herein are provided to make the disclosed contents thorough and complete and sufficiently transfer the spirit of the described technology to those skilled in the art.

In the drawings, the thicknesses of layers and regions may be exaggerated for clarity. In addition, when a layer is described as formed on another layer or on a substrate, the layer may be formed on the other layer or on the substrate, or a third layer may be interposed between the layer and the other layer or the substrate Like reference numerals designate like elements throughout the specification. The term "substantially" as used in this disclosure means completely, almost completely, or to any significant degree.

An organic light-emitting diode (OLED) display according to an exemplary embodiment will now be described with reference to FIGS. 1 to 10.

Figure 2:
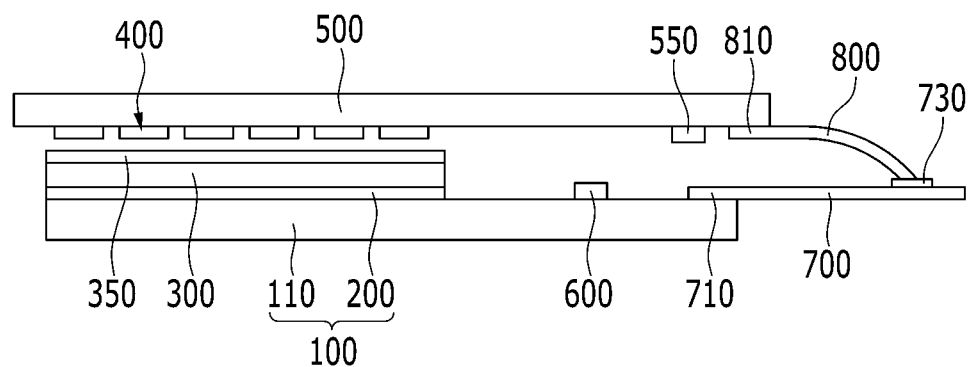
FIG. 2 is a schematic lateral view of the OLED display illustrated in FIG. 1.

Referring to FIGS. 1 and 2, the OLED display 1000 includes a display substrate 100, an encapsulation substrate 300, a contact sensing layer 400, and a window or transparent layer 500. The display substrate 100 has a greater area than the encapsulation substrate 300 and the window 500, in turn has a greater area than the display substrate 100. The OLED display 1000 further includes a flexible printed circuit display board or display flexible printed circuit board 700 attached to the display substrate 100 and a flexible printed circuit touch board or touch flexible printed circuit board 800 attached to the window 500.

In addition, when viewed in a plane view, the OLED display 1000 includes a display area DA for displaying an image and a peripheral area PA surrounding the display area DA.

The display substrate 100 includes an insulation substrate 110 formed of transparent glass or plastic and a thin film display layer 200 formed on the insulation substrate 110. The thin film display layer 200 includes a plurality of pixels and each pixel includes a switching thin film transistor (TFT) T1, a driving thin film transistor T2, a storage capacitor Cst, and a plurality of OLEDs 70 which will be described later.

The display substrate 100 further includes a display driver 600 for applying driving signals to the pixels of the thin film display layer 200. The display driver 600 is formed on the insulation substrate 110 in the peripheral area PA.

The encapsulation substrate 300 is formed on the thin film display layer 200. The encapsulation substrate 300 is bonded to the insulation substrate with a sealant (not illustrated) so as to function as a sealing substrate.

The window 500 is formed on the encapsulation substrate 300 and is attached to the encapsulation substrate 300 by an adhesive layer 350. The window 500 protects the display substrate 100.

The contact sensing layer 400 is formed on an inner side of the window 500, that is, on a side facing the encapsulation substrate 300. The contact sensing layer 400 is attached to the encapsulation substrate 300 through the adhesive layer 350. The contact sensing layer 400 detects touch input. The touch sensing layer 400 detects the touch input when an object approaches the window 500 or actually contacts it.

Herein, the touch input refers not only to when an external object directly contacts the window 500, but also when the external object approaches the window 500 or hovers in the vicinity of the window 500.

A touch driver 550 is further formed on the inner side of the window 500. The touch driver 550 is formed in the peripheral area PA and receives a sensing input signal to be applied to the contact sensing layer 400 from an external source. The touch driver 550 transmits the sensing input signal to the contact sensing layer 400. The touch driver 550 also receives a sensing output signal from the contact sensing layer 400 and may process the sensing output signal. Capacitors and resistors may further be formed on the inner side of the window 500 in the peripheral area PA in order for the touch driver 550 to process signals.

The flexible printed circuit display board 700 includes a display terminal 710 attached to the insulation substrate 110 and electrically connected to the display driver 600 and an input unit 720 that receives signals from an external source. The flexible printed circuit display board 700 receives the signals from the external source through the input unit 720 and applies the signals to the display driver 600.

The flexible printed circuit touch board 800 is attached to the inner side of the window 500 and includes a touch terminal 810 electrically connected to the touch driver 550. The flexible printed circuit touch board 800 is connected to the flexible printed circuit display board 700 through a connector 730. Accordingly, the flexible printed circuit touch board 800 receives the external signals through the input unit 720.

The flexible printed circuit display board 700 and the flexible printed circuit touch board 800 are bent around an edge of the insulation substrate 110 to be attached to a rear side thereof.

In the standard OLED display, the flexible printed circuit touch board 800 is attached to components such as a touch driver, capacitors, and resistors. In contrast, according to at least one embodiment, no components are attached to the flexible printed circuit touch board 800. Instead, these components are formed on the inner side of the window 500.

Accordingly, the thickness and width of the flexible printed circuit touch board 800 can be reduced such that the overall width of the OLED display 1000 can be reduced.

In some embodiments, the flexible printed circuit touch board 800 is easily bent, and thus, can be bent in other locations in addition to around the edge of the insulation substrate 110.

The contact sensing layer 400 and the touch driver 500 will now be described in detail with reference to FIGS. 3 to 7.

Figure 3:
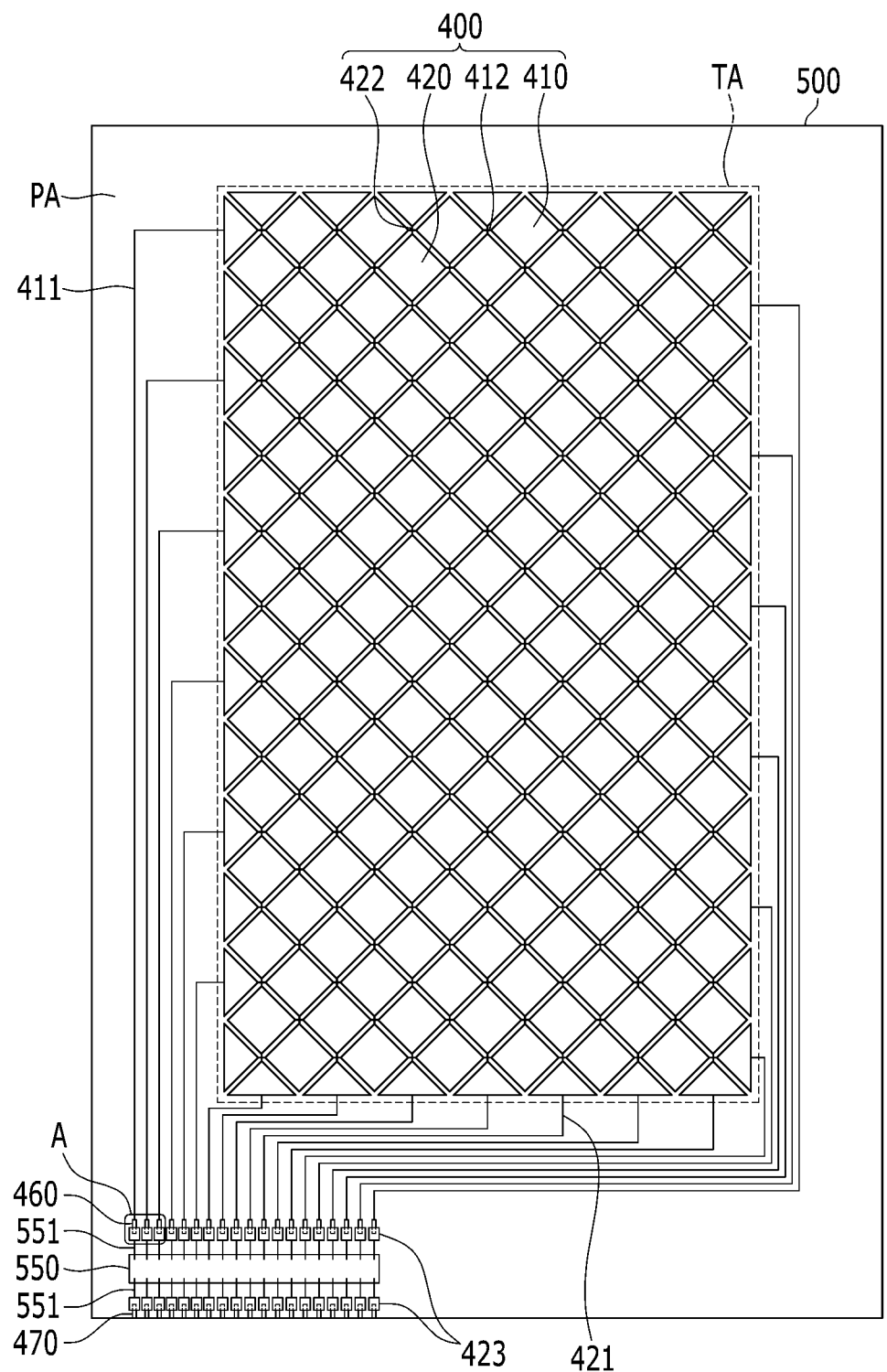
FIG. 3 is a top plan view of the inner side of a window of the OLED display illustrated in FIG. 1.

Referring to FIG. 3, the contact sensing layer 400 and the touch driver 550 are formed, as described above, on the inner side of the window 500. The contact sensing layer 400 is formed in the touch active area TA in which the touch input can be detected. The touch active area TA can be the entire display area DA or can also include a portion of the peripheral area PA as the touch active area TA. Alternatively, only a portion of the display area DA can form the entire touch active area TA.

The contact sensing layer 400 detects the touch input using one of various methods. For example, the touch sensing can be classified based on the detected property such as resistive, capacitive, electro-magnetic (EM), and optical type touch sensing types.

A capacitive touch sensor will be described as an embodiment.

The contact sensing layer 400 includes a plurality of touch electrodes and the touch electrodes include a plurality of first touch electrodes 410 and a plurality of second touch electrodes 420. The first and second touch electrodes 410 and 420 are separated from each other. The first and second touch electrodes 410 and 420 are formed to be alternately arranged such that they do not overlap each other in the touch active area TA.

The first touch electrodes 410 are arranged in a column direction and a row direction and the second touch electrodes 420 are arranged a column direction and a row direction. The first and second touch electrodes 410 and 420 are formed on the same layer. The configuration of the first and second touch electrodes 410 and 420 are not limited to the above description and they can be formed on different layers.

In the FIG. 3 embodiment, the first and second touch electrodes 410 and 420 respectively have a substantially quadrangular shape, but they are not limited thereto. They can have various shapes such as including a protrusion portion in order to improve the sensitivity of the touch sensing layer 400.

The first touch electrodes 410 arranged in the same row or the same column can be electrically connected to each other or separated from each other inside or outside the touch active area TA. Similarly, at least some of the second touch electrodes 420 arranged in the same column or in the same row can be electrically connected to each other or separated from each other inside or outside the touch active area TA.

As illustrated in the FIG. 3 embodiment, the first touch electrodes 410 arranged in the same row are electrically connected to each other inside the touch active area TA and the second touch electrodes 420 arranged in the same column are electrically connected to each other inside the touch active area TA. In more detail, the first touch electrodes 410 arranged in each row are electrically connected to each other through a plurality of first connection portions 412 and the second touch electrodes 420 arranged in each column are electrically connected to each other through a plurality of second connection portions 422.

The first touch electrodes 410 connected to each other in each row are connected to a touch sensor controller (not shown) through first touch wires 411 and the second touch electrodes 420 connected to each other in each column are connected to the touch sensor controller (not shown) through second touch wires 421. The first and second touch wires 411 and 421 are formed in the peripheral area PA as illustrated in FIG. 3 or alternatively they can be formed in the touch active area TA.

End portions of the first and second touch wires 411 and 421 form a first pad portion 460 in the peripheral area PA of the window 500. A second pad portion 470 is formed at a position corresponding to the first pad portion 460. As shown in FIG. 3, each of the first and second pad portions 460 and 470 includes a plurality of pads that are spaced apart from each other.

The touch terminal 810 of the flexible printed circuit touch board 800 is attached to the second pad portion 470. The touch driver 550 is connected to the first and second pad portions 460 and 470. The touch driver 550 is formed to have a substantially quadrangular shape and includes a plurality of touch driver connection portions 551 attached to opposing sides thereof.

Each of the touch driver connection portions 551 is connected to one of the first and second pad portions 460 and 470. The first and second pad portions 460 and 470 are respectively electrically connected to each of the touch driver connection portions 551 through touch driver connection patterns 423. These connections will be described later.

Figure 4:
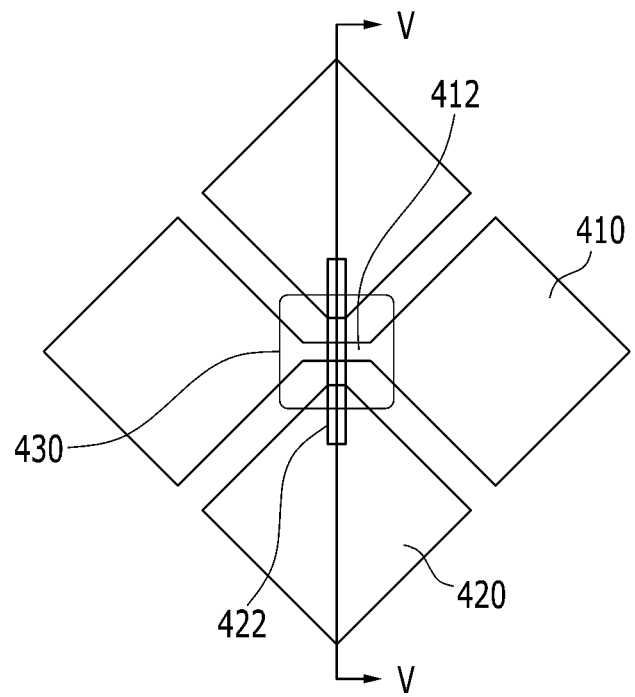
FIG. 4 is a partial enlarged view of the contact sensing layer illustrated in FIG. 3.
Figure 5:
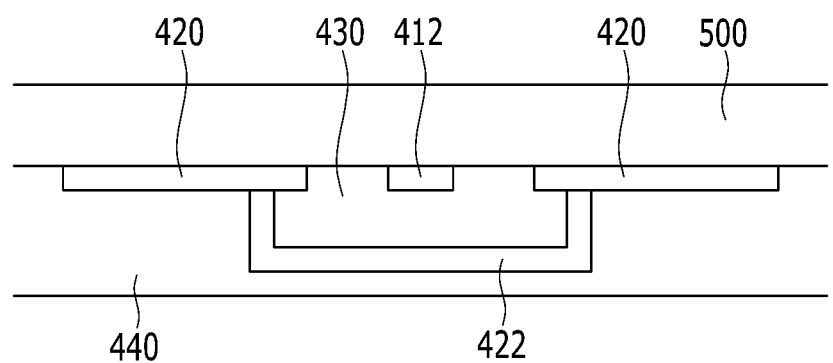
FIG. 5 is a cross-sectional view of FIG. 4 taken along the line V-V.

Referring to FIGS. 4 and 5, the first and second touch electrodes 410 and 420 are formed on the inner side of the window 500. The first connection portions 412 interconnecting the neighboring first touch electrodes 410 is further formed on the inner side of the window 500. The first connection portions 412 may be formed of the same material as the first touch electrodes 410. That is, the first touch electrodes 410 and the first connection portions 412 may be simultaneously patterned to be integrally formed.

According to some embodiments, the second connection portions 422 interconnecting the neighboring second touch electrodes 420 are formed on a different layer from the second touch electrodes 420. That is, the second touch electrodes 420 and the first connection portions 412 are separately patterned to be separately formed. The second touch electrodes 420 and the second connection portions 422 directly contact to be electrically connected to each other.

A first insulation layer 430 is formed between the first and second connection portions 412 and 422 to insulate the first connection portions 412 from the second connection portions 422. According to some embodiments, the first insulation layers 430 is, as illustrated in FIGS. 4 and 5, a plurality of separate island-shaped insulators formed at the intersections between the first and second connection portions 412 and 422.

The first insulation layer 430 exposes at least a portion of the second touch electrodes 420 such that the second connection portions 422 are electrically connected to the second touch electrodes 420. The first insulation layer 430 may have round corners or a polygonal shape and may be formed of a silicon oxide ($SiO_x$), a silicon nitride ($SiN_x$), or a silicon oxynitride ($SiO_xN_y$).

A second insulation layer 440 is formed on the first touch electrodes 410, the second touch electrodes 420, and the second connection portions 422. The second insulation layer 440 is formed over the entire touch active area TA and may be formed of a silicon oxide (SiOx), a silicon nitride (SiNx), or a silicon oxynitride (SiOxNy). The second insulation layer 440 is attached to the adhesive layer 350.

The first and second touch electrodes 410 and 420 have a higher transmittance than a predetermined level so as to transmit light from the thin film display layer 200 therethrough. For example, the first and second touch electrodes 410 and 420 may be formed of a thin metal layer such as indium tin oxide (ITO), indium zinc oxide (IZO), or silver nanowire (AgNw), or a transparent conductive material such as a metal mesh or carbon nanotubes (CNT), but they are not limited thereto.

The first and second touch wires 411 and 421 and the first and second pad portions 460 and 470 may also contain the transparent conductive material forming the first and second touch electrodes 410 and 420. That is, the first and second touch wires 411 and 421 and the first and second pad portions 460 and 470 may be simultaneously patterned with the first and second touch electrodes 410 and 420.

The second connection portions 422 may contain a low resistance material such as molybdenum (Mo), silver (Ag), titanium (Ti), copper (Cu), aluminum (Ti), or molybdenum/aluminum/molybdenum (Mo/Al/Mo).

The first and second touch electrodes 410 and 420 neighboring each other form a mutual sensing capacitor to function as a touch sensor.

The mutual sensing capacitor receives the sensing input signal through one of the first and second touch electrodes 410 and 420 and outputs the sensing output signal, which is a change in the stored charge caused by the touch input, through the other touch electrode.

Alternatively, in contrast to the FIGS. 3 to 5 embodiment, the first and second touch electrodes 410 and 420 may be separated from each other to be respectively connected to the touch sensor controller through separate touch wires (not shown). In these embodiments, each of the touch electrodes forms a self-sensing capacitance as a touch sensor. The self-sensing capacitance receives the sensing input signal to be charged with a predetermined electric charge. After receiving touch input, a sensing output signal different from the sensing input signal is output when the stored charge is changed.

Figure 6:
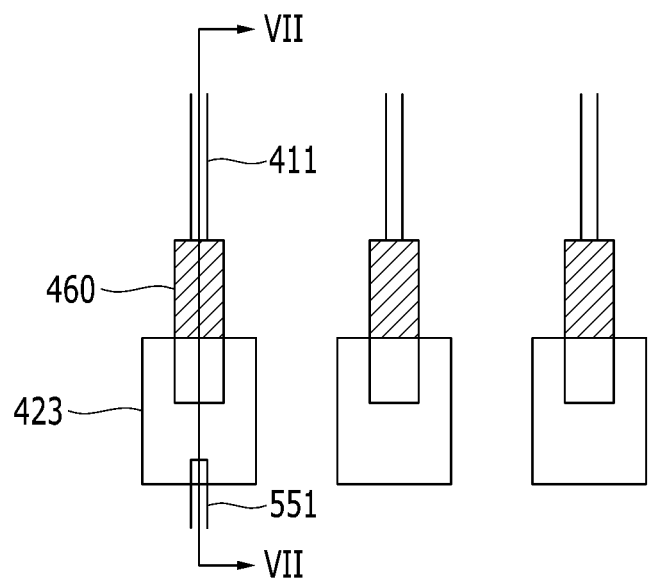
FIG. 6 is an enlarged view of the region "A" illustrated in FIG. 3.
Figure 7:
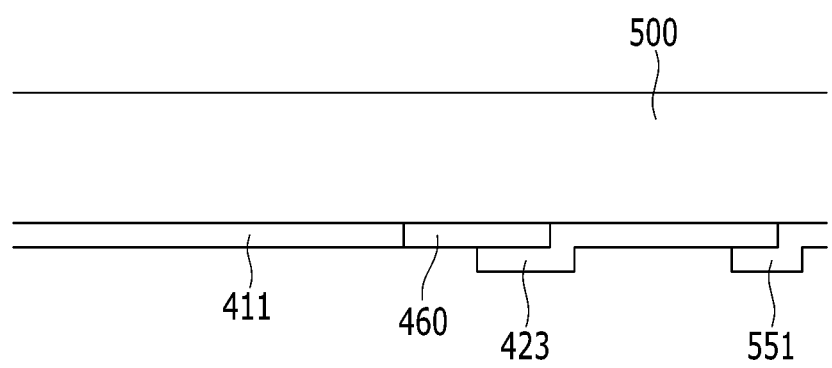
FIG. 7 is a cross-sectional view of FIG. 6 taken along the line VII-VII.

Referring to FIGS. 6 and 7, the first pad portion 460 is formed at end portions of the first touch wires 411 and the touch driver connection pattern 423 is connected to the first pad portion 460. The touch driver connection portion 551 is connected to the first pad portion 460 and the first touch wires 411 through the touch driver connection pattern 423. The first touch wires 411 and the first pad portion 460 are formed on the inner side of the window 500.

Though not illustrated, the second touch wires 412 and the second pad portion 470 are also formed on the inner side of the window 500. That is, the first and second touch wires 411 and 421 and the first and second pad portions are formed on the same layer.

The touch driver connection pattern 423 is electrically connected to and overlap the first pad portion 460. The touch driver connection pattern 423 overlapping the first pad portion 460 is formed on a different layer from the first pad portion 460 such that the overlapping portions are formed on the same layer as the second connection portions 422.

The touch driver connection pattern 423 contains a low resistance material such as the material forming the second connection portions 422. Accordingly, the touch driver connection pattern 423 may be simultaneously patterned with the second connection portions 422.

Although not illustrated, the second pad portion 470 is also connected to and overlaps the touch driver connection pattern 423. The portions of the touch driver connection pattern 423 overlapping the second pad portion 470 are formed on a different layer from the second pad portion 470. Similarly, the touch driver connection pattern 423 are formed of the same material as the second connection portions 422 and are positioned such that the touch driver 550 can be formed on the inner side of the window 500. Capacitors and resistors for signal processing may also be formed on the touch driver connection pattern 423.

The thin film display layer will now be described in detail with reference to FIGS. 8 to 10.

As described above, the thin film display layer 200 includes a plurality of pixels. FIG. 8 is an equivalent circuit diagram of a pixel of the OLED display illustrated in FIG. 1.

Figure 8:
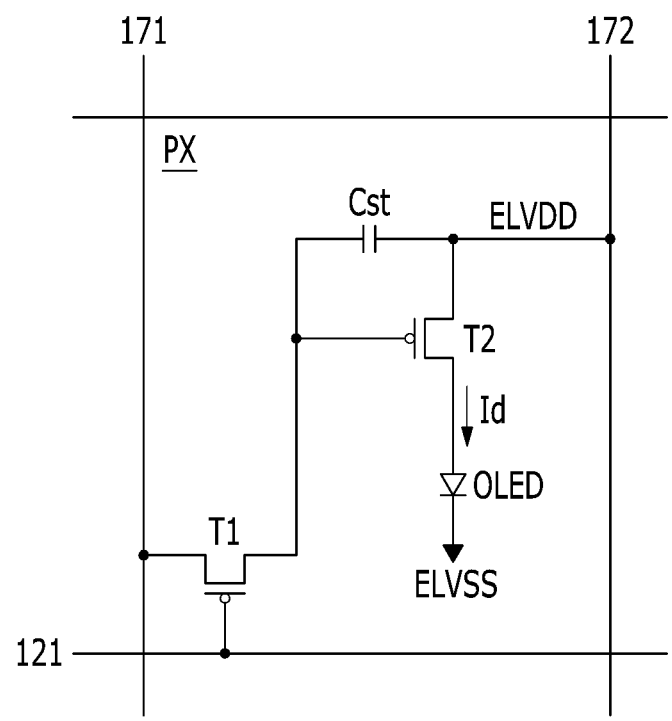
FIG. 8 is an equivalent circuit diagram of a pixel of the OLED display illustrated in FIG. 1.

Referring to FIG. 8, the OLED display includes a plurality of signal lines 121, 171, and 172, and a plurality of pixels PX connected thereto and arranged in a matrix. The signal lines include a plurality of gate lines 121 transmitting gate signals (or scan signals), a plurality of data lines 171 transmitting data signals, and a plurality of driving voltage lines 172 transmitting a driving voltage ELVDD. The gate and data signals are applied through the display driver 600.

The gate lines 121 extend in a row direction substantially parallel to each other and the data lines 171 and the driving voltage lines 172 extend in a column direction substantially parallel to each other.

Each pixel PX includes a switching thin film transistor (TFT) T1, a driving thin film transistor T2, a storage capacitor Cst, and an OLED. The switching thin film transistor T1 has a control terminal, an input terminal, and an output terminal. The control terminal is connected to the gate line 121, the input terminal is connected to the data line 171, and the output terminal is connected to the driving thin film transistor T2.

The switching thin film transistor T1 transfers the data signal, received from the data lines 171, to the driving thin film transistor T2 in response to the gate signal received from the gate lines 121.

The driving thin film transistor T2 also has a control terminal, an input terminal, and output terminal. The control terminal is connected to the switching thin film transistor T2, the input terminal is connected to the driving voltage line 172, and the output terminal is connected to the OLED.

The driving thin film transistor T2 outputs an output current Id which has a magnitude based on the voltage applied between the control terminal and the output terminal of the driving thin film transistor T2.

The storage capacitor Cst is connected between the control and input terminals of the driving thin film transistor T2. The storage capacitor Cst is charged with the data signal applied to the control terminal of the driving thin film transistor T2 and maintains the data signal even after the switching thin film transistor T1 is turned off.

The OLED includes an anode connected to the output terminal of the driving thin film transistor T2 and a cathode connected to the common voltage ELVSS. The OLED displays an image by emitting light with an intensity that varies according to the output current Id of the driving thin film transistor T2.

The switching and driving thin film transistors T1 and T2 may be n-channel field effect transistors or p-channel field effect transistors.

In addition, the connection structure between the switching and driving thin film transistors T1 and T2, the storage capacitor Cst, and the OLED can be varied based on the design requirements of the OLED display.

Figure 9:
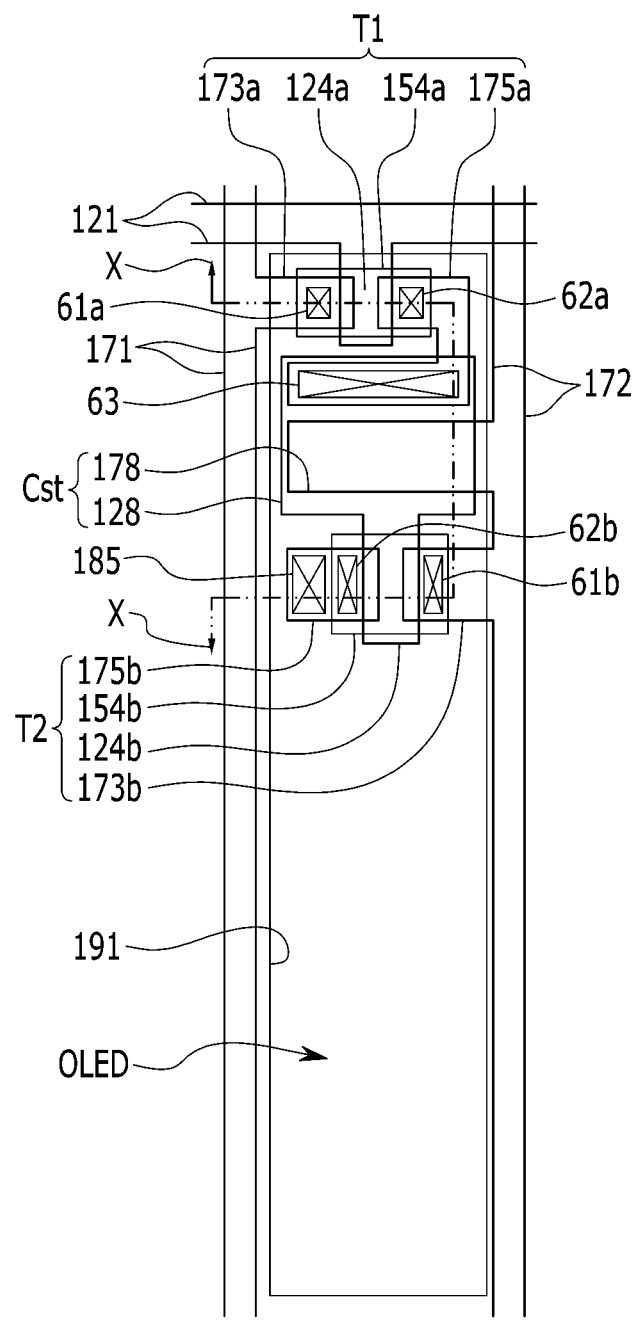
FIG. 9 is a layout view of the pixel of the OLED display illustrated in FIG. 1.
Figure 10:
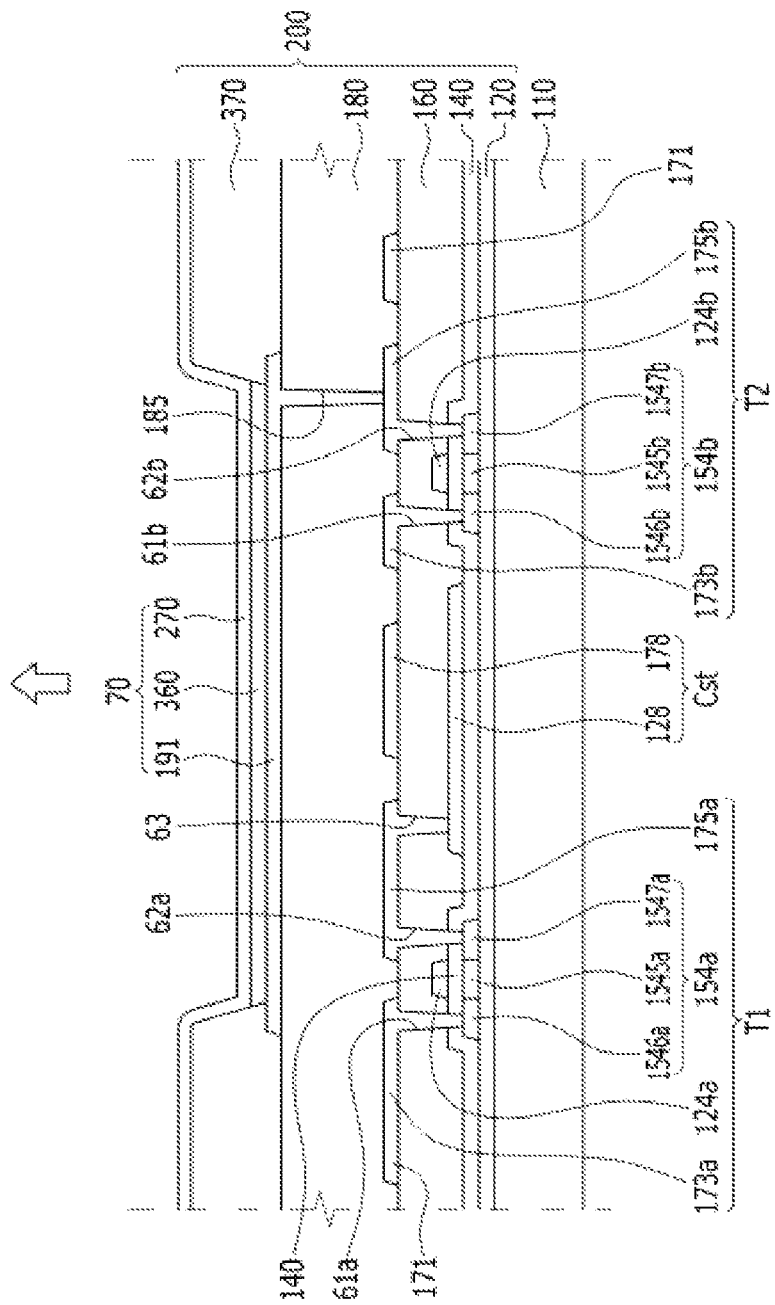
FIG. 10 is a cross-sectional view of FIG. 9 taken along the line X-X.

Referring to FIGS. 9 and 10, the thin film display layer 200 includes a buffer layer 120, switching and driving semiconductor layers 154a and 154b, a gate insulating layer 140, gate lines 121, a first storage capacitor plate 128, an interlayer insulating layer 160, data lines 171, driving voltage lines 172, a switching drain electrode 175a, a driving drain electrode 175b, and a passivation layer 180.

The buffer layer 120 is formed on the insulation substrate 110 and may be formed of a single layer formed of a silicon nitride ($SiN_x$) or a double-layered structure in which a silicon nitride ($SiN_x$) and a silicon oxide ($SiO_x$) are laminated. The buffer layer 120 planarizes a surface of the insulating substrate 110 and prevents unnecessary materials such as impurities or moisture from penetrating therethrough.

The switching and driving semiconductor layers 154a and 154b are formed to be spaced apart on the buffer layer 120. The switching and driving semiconductor layers 154a and 154b are formed of polycrystalline silicon and include channel regions 1545a and 1545b, source regions 1546a and 1546b, and drain regions 1547a and 1547b.

The source regions 1546a and 1546b and the drain regions 1547a and 1547b are respectively formed on opposing sides of the channel regions 1545a and 1545b. The channel regions 1545a and 1545b are formed of polysilicon in which no impurities are doped, that is, an intrinsic semiconductor, and the source regions 1546a and 1546b and the drain regions 1547a and 1547b are formed of polysilicon in which conductive impurities are doped, that is, a doped semiconductor.

The gate insulating layer 140 is formed on the channel regions 1545a and 1545b of the switching and driving semiconductor layers 154a and 154b. The gate insulating layer 140 may be a single layer or multiple layers containing one or more of a silicon nitride and a silicon oxide.

The gate lines 121 and the first storage capacitor plate 128 are formed on the gate insulating layer 140.

The gate line 121 extends in a horizontal direction to transmit a gate signal and includes a switching gate electrode 124a protruding towards the switching semiconductor layer 154a from the gate line 121.

The first storage capacitor plate 128 includes a driving gate electrode 124b protruding therefrom towards the driving semiconductor layer 154b.

The switching gate electrode 124a and the driving gate electrode 124b respectively overlap the channel regions 1545a and 1545b.

The interlayer insulating layer 160 is formed on the gate lines 121, the first storage capacitor plate 128, and the gate insulating layer 140.

A switching source contact hole 61a and a switching drain contact hole 62a respectively exposing the source region 1546a and the drain region 1547a of the switching semiconductor layer 154a are formed on the interlayer insulating layer 160. A driving source contact hole 61b and a driving drain contact hole 62b respectively exposing the source region 1546b and the drain region 1547b of the driving semiconductor layer 154b are further formed on the interlayer insulating layer 160.

The data line 171, the driving voltage line 172, the switching drain electrode 175a, and the driving drain electrode 175b are formed on the interlayer insulating layer 160. The data line 171 transmits a data signal, extends in a direction crossing the gate lines 121, and includes a switching source electrode 173a protruding towards the switching semiconductor layer 154a from the data lines 171.

The driving voltage line 172 transmits a driving voltage and is separated from the data line 171 to extend in substantially the same direction as the data line 171. The driving voltage line 172 includes a driving source electrode 173b protruding towards the driving semiconductor layer 154b from the driving voltage line 172 and a second storage capacitor plate 178 protruding from the driving voltage lines 172 to overlap the first storage capacitor plate 128.

The first storage capacitor plate 128 and the second storage capacitor plate 178 form the storage capacitor Cst with the interlayer insulating layer 160 as a dielectric material interposed therebetween.

The switching drain electrode 175a faces the switching source electrode 173a and the driving drain electrode 175b faces the driving source electrode 173b. The switching source electrode 173a and the switching drain electrode 175a are respectively connected to the source and drain regions 1546a and 1547a of the switching semiconductor layer 154a through the switching source contact hole 61a and the switching drain contact hole 62a. The switching drain electrode 175a is elongated to be electrically connected to the first storage capacitor plate 128 and the driving gate electrode 124b through a first contact hole 63 formed in the interlayer insulating layer 160.

The driving source and drain electrodes 173b and 175b are respectively connected to the source and drain regions 1546b and 1547b of the driving semiconductor layer 154b through the driving source and drain contact holes 61b and 62b.

The switching semiconductor layer 154a, the switching gate electrode 124a, the switching source electrode 173a, and the switching drain electrode 175a form the switching thin film transistor T1. The driving semiconductor layer 154b, the driving gate electrode 124b, the driving source electrode 173b, and the driving drain electrode 175b form the driving thin film transistor T2.

The passivation layer 180 is formed on the data lines 171, the driving voltage lines 172, the switching drain electrode 175a, and the driving drain electrode 175b. A second contact hole 185 exposing the driving drain electrode 175b is formed in the passivation layer 180.

An OLED 70 and a pixel defining layer 370 are formed on the passivation layer 180. The OLED 70 includes a pixel electrode 191, an organic emission layer 360, and a common electrode 270. The pixel electrode 191 is formed on the passivation layer 180 and is electrically connected to the driving drain electrode 175b of the driving thin film transistor T2 through the second contact hole 185 formed in the interlayer insulating layer 160.

The pixel electrode 191 is an anode of the OLED 70. The pixel electrode 191 may be formed of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 370 is formed on edge portions of the pixel electrode 191 and the passivation layer 180. The pixel defining layer 370 has an opening through which the pixel electrode 191 is exposed. The pixel defining layer 370 may be formed of a polyacryl-based resin or a polyimide-based resin.

The organic emission layer 360 is formed on the pixel electrode 191 in the opening in the pixel defining layer 370. The organic emission layer 360 consists of multiple layers including one or more selected from an emission layer, a hole-injection layer (HIL), a hole-transporting layer (HTL), an electron-transporting layer (ETL), and an electron-injection layer (EIL). When the organic emission layer 360 includes all of the abovementioned layers, the hole-injection layer is formed on the pixel electrode 191 as the anode, and the hole-transporting layer, the emission layer, the electron-transporting layer, and the electron-injection layer are sequentially laminated thereon.

The organic emission layer 360 includes a red, green, or blue organic emission layer emitting red, green, or blue light. The red, green, and blue organic emission layers are respectively formed in red, green, and blue pixels to implement a color image.

Alternatively, the red, green, and blue organic emission layers can be integrally laminated on the organic emission layer 360 of each pixel and red, green, and blue color filters respectively formed in the pixels to implement a color image.

As another example, a white organic emission layer emitting white light is formed in each of the red, green, and blue pixels and red, green, and blue color filters are respectively formed over the pixels to implement a color image.

When the color image is implemented using the white organic emission layer and color filters, a deposition mask for depositing the red, green, and blue organic emission layers is not required.

The white organic emission layer described in another exemplary embodiment can be formed to have a single organic emission layer or can be further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

The common electrode 270 is formed on the pixel defining layer 370 and the organic emission layer 360.

The common electrode 270 may be formed of a transparent conductive material such as indium tin oxide (ITO), indium zinc oxide (IZO), zinc oxide (ZnO), or indium oxide ($In_2O_3$), or a reflective metal such as lithium, calcium, lithium fluoride/calcium, lithium fluoride/aluminum, aluminum, silver, magnesium, or gold. The common electrode 270 is a cathode of the OLED 70.

While the inventive aspects have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a display substrate;
   an encapsulation substrate disposed over the display substrate;
   a window disposed over the encapsulation substrate, wherein the window includes a surface facing the display substrate;
   a contact sensing layer disposed on the surface of the window and comprising a plurality of first touch electrodes and a plurality of second touch electrodes formed on the same layer as the first touch electrodes; and
   a plurality of first touch wires respectively electrically connected to the first touch electrodes,
   a plurality of second touch wires respectively electrically connected to the second touch electrodes,
   a first pad portion formed end portions of the first and second touch wires, and
   a touch driver disposed on and in direct contact with the surface of the window and electrically connected to the contact sensing layer, wherein the touch driver is configured to drive the touch sensing layer,
   wherein the touch driver is electrically connected to the first pad portion via a touch driver connection pattern,
   wherein the touch driver connection pattern are electrically connected to the first pad portion,
   wherein at least a portion of the touch driver connection pattern overlaps the first pad portion, and
   wherein the portion of the touch driver connection pattern is formed on a different layer from the first pad portion.

2. The OLED display of claim 1, wherein the first and second touch electrodes are alternately arranged so as to not overlap each other, wherein the first touch electrodes are electrically connected to each other in a first direction via a plurality of first connection portions, and wherein the second touch electrodes are electrically connected to each other in a second direction crossing the first direction via a plurality of second connection portions.

3. The OLED display of claim 2, wherein the first connection portions are disposed on the same layer as the first touch electrodes and wherein the second connection portions are formed on a different layer from the second touch electrodes.

4. The OLED display of claim 3, wherein end portions of the first and second touch wires form a first pad portion, and wherein the first touch wires, the second touch wires, and the first pad portion are disposed on the same layer as the first and second touch electrodes.

5. The OLED display of claim 4, wherein the portion of the touch driver connection pattern is disposed on the same layer as the second connection portions.

6. The OLED display of claim 5, wherein the touch driver connection pattern and the second connection portions are disposed of the same material.

7. The OLED display of claim 1, further comprising a touch flexible printed circuit board attached to the surface of the window.

8. The OLED display of claim 7, wherein the touch flexible printed circuit board is electrically connected to the touch driver.

9. The OLED display of claim 8, further comprising a display flexible printed circuit board attached to the display substrate.

10. The OLED display of claim 9, wherein the touch flexible printed circuit board is electrically connected to the display flexible printed circuit board via a connector.

11. The OLED display of claim 1, wherein the display substrate includes an insulation substrate and a thin film display layer disposed over the insulation substrate.

12. The OLED display of claim 11, wherein the thin film display layer includes a plurality of pixels and wherein each of the pixels includes an OLED.

13. The OLED display of claim 1, wherein the display substrate comprises a display area and a peripheral area, wherein the touch driver is disposed in the peripheral area, and wherein the touch driver does not overlap the encapsulation substrate.

* * * * *